(12) United States Patent
Xu et al.

(10) Patent No.: US 7,119,418 B2
(45) Date of Patent: Oct. 10, 2006

(54) SUPERCRITICAL FLUID-ASSISTED DEPOSITION OF MATERIALS ON SEMICONDUCTOR SUBSTRATES

(75) Inventors: Chongying Xu, New Milford, CT (US); Thomas H. Baum, New Fairfield, CT (US); Michael B. Korzenski, Danbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/632,009

(22) Filed: Jul. 31, 2003

(65) Prior Publication Data
US 2004/0023453 A1 Feb. 5, 2004

Related U.S. Application Data

(63) Continuation-in-part of application No. 10/303,479, filed on Nov. 25, 2002.

(60) Provisional application No. 60/345,738, filed on Dec. 31, 2001.

(51) Int. Cl.
H01L 23/58 (2006.01)
(52) U.S. Cl. .................. 257/639; 257/771; 438/778
(58) Field of Classification Search .............. 257/639, 257/640, 645, 649, 751, 771; 438/190, 210, 438/238, 393, 394, 395, 778
See application file for complete search history.

(56) References Cited

U.S. PATENT DOCUMENTS

| 4,970,093 | A | * | 11/1990 | Sievers et al. ............. 427/575 |
| 5,211,342 | A | | 5/1993 | Hoy et al. |
| 5,225,561 | A | | 7/1993 | Kirlin et al. |
| 5,453,494 | A | | 9/1995 | Kirlin et al. |
| 5,789,027 | A | | 8/1998 | Watkins et al. |
| 5,820,664 | A | | 10/1998 | Gardiner et al. |
| 5,840,897 | A | | 11/1998 | Kirlin et al. |
| 5,952,040 | A | * | 9/1999 | Yadav et al. ............. 427/126.3 |
| 6,110,529 | A | | 8/2000 | Gardiner et al. |
| 6,194,650 | B1 | * | 2/2001 | Wakayama et al. ......... 136/256 |
| 6,207,522 | B1 | | 3/2001 | Hunt et al. |
| 6,245,150 | B1 | * | 6/2001 | Lyons et al. ................ 118/726 |
| 6,284,655 | B1 | * | 9/2001 | Marsh ......................... 438/681 |
| 6,403,663 | B1 | | 6/2002 | DeSimone et al. |
| 6,576,345 | B1 | | 6/2003 | Van Cleemput et al. |
| 6,592,938 | B1 | * | 7/2003 | Pessey et al. ................ 427/212 |
| 6,652,920 | B1 | * | 11/2003 | Carbonell et al. ......... 427/430.1 |
| 6,653,236 | B1 | | 11/2003 | Wai et al. |
| 6,818,301 | B1 | * | 11/2004 | Obeng et al. ............. 428/411.1 |

OTHER PUBLICATIONS

U.S. Appl. No. 10/632,009, filed Nov. 25, 2002, Xu, et al.
Brian N. Hansen, et al., "Supercritical Fluid Transport-Chemical Deposition of Films" Chemical Materials, 1992, 4, 749-752.
Jason M. Blackburn, et al., "Deposition of Conformal Copper and Nickel Films from Supercritical Carbon Dioxide" Science, vol. 294, Oct. 5, 2001, pp. 141-145.
C.Y. Xu, et al., "Supercritical Carbon Dioxide Assisted Aerosolization for Thin Film Deposition, Fine Powder Generation, and drug delivery", Green Chemistry, Editors: Anastas, Paul T., et al. Oxford University Press, Oxford, UK, pp. 312-335.

* cited by examiner

Primary Examiner—Phuc T. Dang
(74) Attorney, Agent, or Firm—Margaret Chappuis; Tristan A. Fuierer; Moore & Van Allen PLLC

(57) ABSTRACT

Supercritical fluid-assisted deposition of materials on substrates, such as semiconductor substrates for integrated circuit device manufacture. The deposition is effected using a supercritical fluid-based composition containing the precursor(s) of the material to be deposited on the substrate surface. Such approach permits use of precursors that otherwise would be wholly unsuitable for deposition applications, as lacking requisite volatility and transport characteristics for vapor phase deposition processes.

114 Claims, No Drawings

SUPERCRITICAL FLUID-ASSISTED DEPOSITION OF MATERIALS ON SEMICONDUCTOR SUBSTRATES

CROSS-REFERENCE TO RELATED APPLICATION

This is a continuation-in-part of U.S. patent application Ser. No. 10/303,479 filed Nov. 25, 2002, which in turn claims the priority of U.S. provisional patent application No. 60/345,738 filed Dec. 31, 2001.

FIELD OF THE INVENTION

The present invention relates generally to using supercritical fluids to effect the deposition of materials on substrates, e.g., semiconductor substrates, in the manufacture of semiconductor devices and device precursor structures.

DESCRIPTION OF THE RELATED ART

In the field of semiconductor manufacturing, deposition of materials on semiconductor substrates is carried out by a variety of techniques, including chemical vapor deposition (CVD), physical vapor deposition (PVD) and electroplating (for metallization and interconnect formation).

Conventional CVD processes require volatile precursors for the formation of precursor vapors that are transported to the chemical vapor deposition chamber. However, many chemical species are neither thermally stable enough, nor volatile enough, for sustained vaporization, delivery and deposition. As a consequence, CVD processes for film deposition are largely limited by the availability of volatile and stable precursors as source reagents.

PVD, utilizing a charged gas and a sputter target to effect deposition of material on a substrate, is well-developed and widely used in the art, but is limited by the significant particle levels that are generated in the process, as well as by constraints on controllability and conformality of the deposition process when tight geometries and small features are involved, and by process control issues relating to diffusion of the sputtered material. Due to the ballistic nature of sputtered materials, it is extremely difficult to achieve conformal coverage on complex topography of next generation patterned substrates.

Physical vapor deposition is currently a preferred technique for depositing high purity metal films, but conventional PVD methods tend to produce thin bottom-corner coverage in deep vias or trenches, thereby producing a potential weak point for barrier performance. Since aspect ratios are a critical factor in evolving device microstructures, it is likely that in the very near future the PVD technique will not be able to provide sufficient step coverage to deposit the diffusion barrier at the required thickness at all points within the high aspect ratio via. Accordingly, a deposition technique with good conformal coverage such as chemical vapor deposition or chemical fluid deposition will be required to deposit diffusion barriers as aspect ratios of integrated circuit devices increase.

Currently, many integrated circuit (IC) processes require low cost deposition of conformal thin-films for interconnect and dielectric structures. The ability to deposit thin films, e.g., having a thickness below about 1 μm, depends on the gas-phase transport of volatile organometallic precursors that decompose at elevated temperatures onto patterned substrates. Although many of such processes are extremely well-developed for advanced microelectronic device manufacture, the application of these processes for high aspect ratio via filling is burdened by difficulties.

For deposition of conducting materials such as copper, CVD processes therefore can only compete with electroplating techniques (aqueous based processes) when the cost of ownership (COO) for the process is small. The semiconductor industry is currently moving toward copper interconnect lines due to their decreased resistivity and increased resistance to electromigration, as well as the high melting point of copper metallization. Copper additionally has good adhesion to all surfaces, good step coverage, good stability and reliability (including corrosion resistance), ability to be anisotropically etched, and ability to survive subsequent process steps (post-metallization processing).

As a result of these factors, copper metallization techniques have been extensively studied in recent years, with respect to deposition techniques including physical, chemical and electrical routes. Chemical vapor deposition (CVD) and electrochemical deposition (ECD) have gained the most attention and are currently the most widely used and successful techniques for the deposition of copper metal films. However, low equilibrium vapor pressure of available precursors and mass-transfer-limited kinetics in the CVD and ECD processes, respectively, leads to poor control over the deposition process.

Additionally, copper diffuses readily into oxides and dielectrics, causing line-to-line leakage. Moreover, the copper can readily react with silicon at temperatures below 200° C., causing detrimental effects that can ultimately lead to device failure. Therefore, diffusion barriers that are effective against copper out-diffusion are needed to eliminate this problem. The required barrier layers must be conformal, continuous and as thin as possible. In addition, the barrier material should exhibit low film resistivity, and be dimensionally accommodating to maximize the cross section of copper. Further, the barrier film should be a good adhesion layer for copper deposition and easy to remove by chemical mechanical polishing.

At dimensions of <0.1 micron, copper-porous low k multi-layers may require special, non-aqueous processing to avoid aqueous contamination of the low k pore structures and decreased device yields, and to enhance device reliability. Further, the dielectric constant of the low k material is critical and aqueous contamination can negatively increase dielectric constants, which is largely unacceptable. Still further, electroplating requires a conformal, conductive and uniform seed layer to enable the technique. The seed layer is deposited by PVD in conventional practice. With decreasing feature size and increasing aspect ratio, the use of PVD to obtain the required seed layers becomes a major technical challenge. Although ionized PVD conceivably could be useful for such purpose, alternative techniques are required, which are compatible with low k dielectrics.

Concerning the low k dielectrics themselves, a wide variety of precursors are employed in the art, and the art is continually seeking new materials for forming low k films. Alkyl siloxanes and cyclosiloxanes such as TMCTS (tetramethylcyclotetrasiloxane) and OMCTS (octamethylcyclotetrasiloxane) are promising precursors for deposition of such films, but are susceptible to the presence of trace amounts of impurities that can lead to undesirable cationic or anionic polymerization. High temperatures accelerate such polymerizing degradation in delivery lines of the deposition system. For example, TMCTS polymerizes in delivery lines at temperatures above ~120° C. Polymerization of such reagents can produce occlusion of reagent delivery lines and associated equipment, with catastrophic consequences in the semiconductor processing facility.

The semiconductor industry is currently at a crossroads in the application of low dielectric constant materials, as device performance requirements require a transition from vapor-deposited silicon dioxide (k=4.0) to a material with a dielectric constant less than 2.0. Unfortunately, there are few known materials with dielectric constants this low, and none of such known materials is compatible with semiconductor manufacturing requirements. Accordingly, major efforts to develop new materials and processes for the successful implementation of ultra-low dielectric constant materials (k<2.0) into integrated circuits is currently underway in many laboratories worldwide.

Porous organosilicates can be prepared by vitrification of silsesquioxane (SSQ) precursor polymers templated by thermally labile intrinsically organic macromolecular pore generators (porogens). The dielectric constants of typical cured, densified SSQ matrix materials range from about 2.6 to about 3.1, as compared with dielectric constants of ~4.0 for current silicon dioxide insulators. The utilization of porous insulator polymeric materials, however, introduces a new and unique set of integration issues. The deficiencies of CVD-grown low k polymeric materials include premature degradation and/or polymerization of the precursors in delivery lines caused by the high temperatures typically employed, as discussed hereinabove, with the potential for catastrophic consequences within the processing tool.

Concerning high k materials, on the other hand, lead zirconium titanate (PZT), barium strontium titanate (BST) nad strontium bismuth tantalate (SBT) have been shown to be promising ferroelectric materials for non-volatile random access memory (NVRAM), capacitors in dynamic random access memory (DRAM) and gate insulator in metal/ferroelectric/semiconductor field effect transistor (MFS-FET) applications, because of their high remanent polarization and dielectric constant. Additionally, these high dielectric materials are considered important candidates for next generation gate dielectric layers where thicknesses <10 nm will be required. High k oxides offer a solution to leakage problems that occur as gate oxide thicknesses are scaled down. By using an electrically equivalent thickness of high k dielectrics, leakage can be greatly reduced, e.g., by >5 orders of magnitude, allowing continued scale-down of devices such as MOSFETs.

Growing interest in such high k oxide material films has shown a steep increase over the last decade. However, thin films of controlled stoichiometry are somewhat difficult to fabricate. Thin films formed by PVD at room temperature are amorphous thus annealing above 600° C. is required to crystallize the material. Sol-gel and metalorganic methods also require temperatures of about 600° C. to promote the material synthesis. For most applications, a reduction of the temperature of the deposition process is necessary for avoiding problems such as physical damage and inter-diffusion of mobile ions between adjacent layers. For example, it is very difficult to deposit a PZT film directly on an Si substrate because Pb is highly reactive with Si and easily diffuses into the Si substrate. Accordingly, buffer layers are needed when processing temperatures are high. This leads to an increase in complexity of the overall process as well as an increase in cost. Additionally, to achieve growth on temperature sensitive substrates such as polymeric substrates, lower processing temperatures are required. There is accordingly a need in the art for improved techniques for deposition of high k films.

Another aspect of semiconductor manufacturing, in which deposition issues are presented, is the deposition of electrodes. In particular, noble metal electrodes and/or their respective oxides have been the subject of extensive study in recent years due to the chemical stability, high melting point, high mechanical strength, superior oxidation resistance and high electrical conductivity of such materials. As a result, noble metals and/or their respective oxides are promising candidates for a wide variety of applications such as top layer electrodes in $Pb(Zr_xTi_{1-x})O_3$/Pt ferroelectric capacitors in high density ferroelectric memories, as oxygen-stable electrodes in corrosive materials, and as switching layers in electrochromic devices.

Various methods have been employed in the art for forming noble metal and oxidized noble metal films, with physical vapor deposition having been among the most successful approaches to date. PVD methods, however, have the associated disadvantages of physical damage to the dielectric during sputtering of the metal films and metal diffusion through the dielectric material in the device structure. Accordingly, alternatives to PVD are desired for the deposition of thin films of noble metals.

The foregoing constraints and deficiencies of conventional semiconductor manufacturing deposition techniques reflect the need of the art for improved process technologies that are free of such limitations.

SUMMARY OF THE INVENTION

The present invention relates to supercritical fluid (SCF)-assisted deposition of materials onto substrates.

In one aspect, the invention relates to a deposition composition for depositing material on a substrate, such deposition composition comprising a supercritical fluid and a precursor for the material to be deposited on the substrate.

Another aspect of the invention relates to a method of forming a material on a substrate, comprising depositing the material on the substrate from a deposition composition comprising a precursor of such material, and a supercritical fluid.

In another aspect, the invention relates to a method of forming a barrier layer on a substrate, comprising contacting the substrate in a contacting zone with a deposition composition comprising a barrier layer precursor and a supercritical fluid, and continuing said contacting while flowing the deposition composition into the contacting zone, and discharging contacted deposition composition from said contacting zone, to effect growth of the barrier layer to a predetermined thickness.

A further aspect of the invention relates to a method of metallizing a semiconductor substrate comprising contacting the substrate with a copper metallization precursor in a supercritical fluid, to deposit copper on the substrate.

Yet another aspect of the invention relates to a method of forming electrodes on a semiconductor substrate comprising contacting the substrate with an electrode material precursor in a supercritical fluid, to deposit electrode material on the substrate.

Other aspects, features and embodiments of the present invention will be more fully apparent from the ensuing disclosure and appended claims.

DETAILED DESCRIPTION OF THE INVENTION, AND PREFERRED EMBODIMENTS THEREOF

Supercritical fluids are formed under conditions at which the density of the liquid phase equals the density of the gaseous phase of the substance. For example, carbon dioxide ($CO_2$), which is a gas at standard temperature and pressure, undergoes a transition from liquid to SCF above a critical point, corresponding to $T_c \geq 31.1°$ C. and $p_c \geq 73.8$ atm. Once formed, the density of the SCF can be varied from liquid-like to gaseous-like, yielding different solvation abilities, by varying the pressure and temperature. Supercritical fluids have a solubility and diffusibility approaching that of the liquid and gaseous phase, respectively. Additionally, the surface tension of SCFs is negligible.

Because of its readily manufactured character, ability to be recycled, lack of toxicity and negligible environmental effects, supercritical $CO_2$ is a preferred SCF in the broad practice of the present invention, although the invention may be practiced with any suitable SCF species, with the choice of a particular SCF depending on the specific application involved.

The present invention relates to supercritical fluid-assisted deposition of thin-film (e.g., with a thickness of <1 µm) material on a substrate, e.g., a semiconductor wafer substrate.

Due to the progressively smaller dimensions of semiconductor patterns, the SCF-assisted deposition compositions of the present invention provide a distinct advantage in penetrating small geometry structures such as vias and trenches with high aspect ratios on a semiconductor wafer, as well as achieving improved homogeneity and extent of conformality of the deposited material, e.g., in films, layers and localized material deposits, particularly in instances in which the wettability of the substrate is low, as is the case with many semiconductor substrates.

The deposition compositions of the invention may be variously formulated for specific deposition applications, including suitable SCF(s) and source reagent (precursor) compound(s), complex(es) and material(s). Such compositions may further optionally comprise co-solvent(s), co-reactant(s), surfactant(s), diluent(s), and/or other deposition-facilitating or composition-stabilizing component(s), as necessary or desired for such applications.

In its simplest formulation, the deposition composition comprises at least one SCF and at least one precursor component. The composition thus comprises a supercritical fluid solution in which at least one precursor component is dissolved.

The SCF precursor solution in use can be delivered to a heated substrate for contacting therewith, to deposit on the substrate a material deriving from the precursor component(s). For example, the precursor component may comprise a source reagent compound or organometallic species or metal coordination complex for forming a metal or dielectric film, e.g., a dielectric oxide, on a semiconductor wafer substrate.

By the use of SCF-based deposition compositions, the precursor component(s) can be continuously delivered in a stream of the SCF-based deposition composition to the heated substrate, to deposit the desired material deriving from the precursor component(s) on the substrate surface. Concurrently, by-products of the deposition operation can be continuously carried out of the deposition chamber via continuous flow of the SCF-based composition through the deposition chamber containing the heated pedestal and substrate.

Alternatively, the deposition using the SCF-based deposition composition may be carried out in a batch mode, wherein the deposition composition is contacted with the substrate, and process condition(s) (e.g., temperature and/or pressure) of the composition are altered to effect the deposition of the desired material deriving from the composition.

Examples of SCF species useful in the broad practice of the invention include, but are not limited to, carbon dioxide, oxygen, argon, krypton, xenon, ammonia, methane, methanol, dimethyl ketone, hydrogen, forming gas, and sulfur hexafluoride.

Co-solvent or co-reactant species useful in the deposition compositions of the invention may be of any suitable type. illustrative species include, but are not limited to, methanol, ethanol, and higher alcohols, N-alkylpyrrolidones or N-arylpyrrolidones, such as N-methyl-, N-octyl-, or N-phenyl-pyrrolidones, dimethylsulfoxide, sulfolane, catechol, ethyl lactate, acetone, butyl carbitol, monoethanolamine, butyrol lactone, diglycol amine, y-butyrolactone, butylene carbonate, ethylene carbonate, and propylene carbonate.

Surfactants useful in the deposition compositions of the present invention may likewise be of any suitable type, including anionic, neutral, cationic, and zwitterionic types. Illustrative surfactant species include, without limitation, acetylenic alcohols and diols, long alkyl chain secondary and tertiary amines, and their respective fluorinated analogs.

The components of the SCF-based deposition compositions of the present invention may be present at any suitable concentrations and relative proportions, as appropriate to the use of the composition in depositing material on a substrate surface. For example, the precursor component(s) may be present at concentrations of from about 0.1% by weight to about 98% by weight, with suitable concentrations being dependent on the maximum solubility of the precursor in the supercritical fluid that is employed in the composition. For example, preferred concentration ranges of specific precursors may have any suitable minima (e.g., 0.2%, 0.5%, 1%, 5%, or 8%), and maxima (e.g., 10%, 12%, 15%, 18%, 20%, 25%, 30%, 40%, 50%, 60%, 75%, 80% or 90%), appropriate to the specific supercritical fluid involved. As a further specific example, the concentration of the precursor can be below about 40% when $CO_2$ is used as the supercritical fluid in the SCF-based deposition composition. The foregoing weight percentages are based on the weight of the SCF in the composition.

Further, the deposition compositions of the invention may selectively comprise, consist of, or consist essentially of, any of the SCF, precursor component(s) and optional additional components of the compositions disclosed herein.

Deposition using the SCF-based deposition compositions of the invention may be carried out in any suitable manner, as regards contacting of the deposition composition with the substrate. Chemical vapor deposition techniques may be employed, or other modes of application of the deposition composition to the substrate can be effected.

For example, in one approach, a polymeric or oligomeric precursor species is dissolved in a supercritical fluid to form the SCF-based deposition composition. This deposition composition in solution form then can be sprayed into a fine mist or otherwise aerosolized. When the mist or aerosol is transported onto the substrate surface, polymeric films are formed. This technique is suitable for forming low k films from polymeric, oligomeric, pre-polymeric, or monomeric precursor components, or combinations of same. In some applications, it is desirable to transport the fluid media as a fine mist or aerosol to the substrate surface in a carrier fluid, or alternatively the composition may be delivered to the substrate in neat fluid, mist or aerosol form.

As another variant technique within the broad scope of the present invention, one or more precursor component(s) can be dissolved in a supercritical fluid, with the solution then being subjected to rapid expansion. As a result of such rapid expansion, the precursor component(s) are vaporized into fine vapor particles or nano-sized aerosols (depending on the rapid expansion conditions), and such fine vapor particles or aerosol can be used in CVD-type deposition processes.

The aforementioned techniques are useful for deposition of materials, e.g., metals, for metallization on integrated circuit substrates, formation of electrodes and interconnect structures, barrier layer materials (e.g., nitrides and oxynitrides, of metals such as tantalum, titanium, silicon, tungsten, molybdenum, etc.), low k dielectrics and high k materials, and other materials and thin film compositions. Preferred supercritical fluids for such purpose include carbon dioxide, methane, ethane, methanol, dimethyl ketone and sulfur hexafluoride.

The precursor components for the materials to be deposited on the substrate may be of any suitable type. Illustrative precursor components include, without limitation, organometallic source reagent compounds and complexes, and Lewis base adducts thereof, as well as the semiconductor manufacturing precursor components described in U.S. Pat. No. 5,840,897 issued Nov. 24, 1998, U.S. Pat. No. 5,453,494 issued Jan. 18, 1994, U.S. Pat. No. 6,110,529 issued Aug. 29, 2000, U.S. Pat. No. 5,820,664 issued Mar. 31, 1995, and U.S. Pat. No. 5,225,561 issued Sep. 12, 1990, the disclosures of all of which are hereby incorporated herein by reference, in their respective entireties.

The invention contemplates application of SCF-assisted deposition to any of a wide variety of suitable techniques for depositing materials on substrates.

In one embodiment, SCF-assisted deposition is employed to enhance physical vapor deposition (PVD) processes. In contrast to conventional PVD techniques, which are conducted in an evacuated chamber, utilizing a charged gas and a sputter target for deposition of material on a substrate, e.g., semiconductor wafer, the PVD process can be modified in accordance with the present invention to utilize SCF-assisted deposition techniques. Instead of a low-pressure system, a supercritical fluid, e.g., carbon dioxide and/or argon, or other SCF, is employed.

In carrying out such modified PVD process, it may be desirable to provide an added Lewis base (e.g., $PF_3$) or to conduct the deposition in the presence of media such as CO, to form corresponding metal complexes in the PVD process. Illustrative examples of metal complexes of such type include, without limitation, $Mo(CO)_6$, $W(CO)_6$, $Cr(CO)_6$, $W(PF_3)_6$, $Co_2(CO)_8$, and $Co_2(PF_3)_8$.

By use of an SCF ambient environment in such modified PVD operation, a reduced level of particle generation, improved control of deposition into very tight geometries, improved control of diffusion of the sputtered material, and application of gas phase reactions in the PVD process (for forming barriers, or capping layers) are achievable, relative to conventional PVD techniques.

In another embodiment of the invention, low k films are formed using alkyl silanes, siloxane precursors, and even organic-based non-silicon-containing low k precursors, such as the low k dielectric thermosetting resin sold by The Dow Chemical Company under the trademark SiLK. Silxoane precursors may be of any suitable type, as for example alkyl siloxanes and cyclosiloxanes, such as tetramethylcyclotetrasiloxane (TMCTS) and octamethyltetracyclosiloxane (OMCTS). Other low k film precursor materials can be utilized in the SCF-based deposition process of the present invention to form superior films on substrates, without issues of adverse polymerization effects.

The deposition compositions of the invention therefore include compositions wherein the precursor is a silicon source reagent, e.g., a siloxane in combination with an alkylsilane, e.g., trimethylsilane or tetramethylsilane. In another specific composition, the silicon source reagent comprises a siloxane, which is used in combination with a porogen, to form a porous low k film on the substrate.

The invention resolves a major deficiency of siloxane precursors that has limited the utility of such materials for deposition applications. Specifically, the presence of even trace amounts of impurities in such siloxane precursors poses a risk of cationic or anionic polymerization, particularly at high temperatures, such as would otherwise result in premature degradation in delivery lines to the deposition chamber. For example, TMCTS polymerizes in delivery lines at elevated temperatures, usually about 120° C., with potentially catastrophic consequences to the deposition process and associated equipment.

Such premature degradation problems are overcome by SCF-based precursor delivery and deposition in accordance with the present invention. Supercritical fluid solutions of low k precursors are readily delivered into the growth chamber at low temperature, e.g., as low as 31.1° C., due to the low viscosity of such solutions. Further, at the point that the pressure of the supercritical fluid solution is reduced, the solution undergoes rapid expansion in volume, to vaporize the precursor into a precursor vapor, with no ancillary heating requirement being required.

Thus, the SCF-based deposition techniques of the invention, in application to low k film precursors, reduce thermally-induced polymerization of precursors such as siloxanes. More generally, thermally unstable low k film precursors of variant types are advantageously delivered to the deposition substrate by SCF-based compositions. Examples of such siloxane precursors include TMCTS and OMCTS. SCF species that are particularly useful for such purpose include carbon dioxide, methane, methanol, dimethyl ketone and sulfur hexafluoride.

In one aspect of the present invention involving low k film formation, supercritical fluids are employed to deliver thermally unstable low k precursors for the deposition of mesoporous organo-functionalized silsesquioxane (SSQ) thin films. $SCCO_2$ is a preferred SCF species for such deposition, although other SCF solvents can be employed, such as those illustratively mentioned in the preceding paragraph. Because the SCF exhibits extremely low surface tension, it eliminates the need for energy intensive drying processes, and the products from a polymerization conducted in the SCF are isolated in a completely dry state upon venting of the deposition chamber to remove the re-gasified SCF.

The SCF in general has high solvating character, and can dissolve low k CVD precursors, siloxanes, and silsequioxanes. The high solubility of these precursors in the SCF solution eliminates the need for high processing temperatures employed in CVD, thereby avoiding the problems associated with thermally induced premature degradation of precursor in the delivery lines of the deposition system, as discussed earlier herein.

A critical feature of forming porous low k organosilicate films from SCF-based precursor solutions is the controlled incorporation of air bubbles (air having a dielectric constant of 1.0) in a matrix material to form a mesoscopic composite material having a substantially reduced dielectric constant. In such porous matrix layers, the dielectric constant can be varied by simply increasing or decreasing the level of porosity. Subsequent vitrification of the composite structure followed by degradation of the organic polymer on a heated substrate to volatile fragments then produces the desired porous films. The decomposed organics are readily carried away within the dynamic SCF stream.

Both silsequioxane and siloxane systems are very versatile. It is possible to introduce mixed functionality into the core Si—O framework so as to tailor the properties of the porous silicon layer for specific applications. For example, cube monomers can be prepared in which epoxy and hexyl groups are attached to the same cluster to control the hydrophobicity of the resulting cured polymer. Due to their ease of synthesis, chemical adaptability, low cost and exceptional physical properties, hybrid polymers based on silsequioxanes offer considerable and unique potential for a wide variety of applications in which conventional organic polymers are inadequate.

Silsequioxanes have the following formula

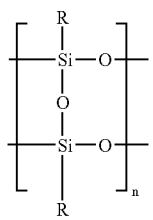

wherein each R is independently selected from H, $C_1$–$C_8$ alkyl, $C_1$–$C_8$ alkenyl, $C_6$–$C_{10}$ aryl and $C_1$–$C_8$ alkoxy. Siloxanes in turn have the formula —(—Si(R)(R)—O—)$_n$— wherein each R is independently selected from H, $C_1$–$C_8$ alkyl, $C_1$–$C_8$ alkenyl, $C_6$–$C_{10}$ aryl and $C_1$–$C_8$ alkoxy.

Silsequioxanes have advantages over their siloxane counterparts, such as higher glass transition temperature and increased thermal stability. Due to their cross-linked character, it would be expected that such polymers would not be soluble in most solvents, however, it has been found that low molecular weight polymers of such structure are soluble in most organic solvents. Additionally, such polymers have the advantage that they are more resistant to oxygen reactive ion etching (RIE) since their structure is similar to that of $SiO_2$. In addition, silsequioxanes exhibit excellent thermal, chemical and UV stability, good mechanical properties and excellent adhesion.

The SCF-based compositions and delivery methods of the invention are also amenable to the formation of high k films. The deposition of high k films from supercritical and solvothermal fluids is a technique in which reaction occurs in a pressure vessel, allowing normal solvents such as water, ammonia, alcohols, carbon dioxide, etc. to be heated to temperatures far in excess of their normal boiling points. The result is an increase in transport properties, diffusion rates and solvating properties of the solvent. These factors enable relatively low temperature synthesis of crystals, bulk powders and thin films of many different material systems.

In application to formation of high k material layers, the use of SCF media enables film formation at temperatures below 300° C., as a result of SCF fluid kinetics. The material employed as a precursor for the high k film can be of any suitable type, as appropriate to the supercritical fluid employed and the film to be formed on the specific substrate. Illustrative of useful metal centered compounds, e.g., with a metal center such as Ba, Sr, La, Ti, Zr, Ta, Pb, etc., are compounds such as $C_1$–$C_8$ alkoxides, β-diketonates, carbonates, hydroxides, acetates, formates, nitrates, halides, $C_6$–$C_{10}$ aryls (e.g., tetraphenyl lead and triphenyl bismuth), $C_1$–$C_8$ alkyls, and combinations of two or more of the foregoing.

Since the polarity of the foregoing compounds can vary significantly from one to another, particularly if polar and non-polar metal sources are used simultaneously, a co-solvent can be usefully incorporated in the SCF-based composition, so that the base solvent of choice and the co-solvent form a polar/non-polar fluid solution. The solvent and co-solvent species can be of any suitable type, with carbon dioxide, water, ammonia and various alcohols being usefully employed in a wide variety of applications for forming high k films.

In another aspect, SCF-based deposition compositions of the invention may be employed for precursor delivery to the substrate, to form barrier layers, e.g., of TiN, TaN, NbN, WN or their corresponding silicides, or interconnect and metallization structures, e.g., of copper, aluminum or other metals, metal alloys and species, on semiconductor substrates. The precursors for such purpose are dissolved in appropriate amounts in SCF media, and contacted with the heated substrate to effect deposition of the desired material.

For barrier layer formation, barrier layer precursor materials may be of any suitable type for forming the aforementioned nitrides and silicides. Illustrative precursor components include, without limitation, titanium (IV) tetrakis-dialkylamides such as tetrakis diethylamido titanium (TDEAT), tetrakis dimethylamino titanium (TDMAT), and pyrozolate titanium compounds and other titanium amido and imido compounds. Illustrative tantalum nitride (TaN) barrier precursor compounds include, without limitation, Ta (IV) pentakis(dialkylamido) compounds, such as pentakis ethylmethylamido tantalum (PEMAT), pentakis dimethylamido tantalum (PDMAT) and pentakis diethylamido tantalum (PDEAT), and their W, Nb corresponding compounds.

For nitride barrier films, supercritical ammonia ($T_c$=132.4° C., $P_c$=113 bar) is an excellent solvent medium for forming nitride films by solvolysis reaction during the decomposition of a metal precursor. Since during thermal decomposition the particle reactivity is very high, nitride formation in a $NH_3$ environment is facilitated. In order to maintain process parameters such as pressure and temperature within permissible limits for integrated circuit processing, metal precursors having relatively low decomposition temperature (e.g., <200° C.) are preferred. In applications in which it is desired to avoid oxide byproducts, non-oxide metal precursors are preferred.

For formation of metal nitride films, supercritical carbon dioxide ($SCCO_2$) is a preferred supercritical fluid solvent since many gases including $H_2$, $O_2$ and $N_2$ are miscible in such SCF solvent. Thus, nitrogen can be incorporated in the SCF fluid as a reactant source for carrying out reactive nitridation using $N_2$ during the decomposition of the metal precursor.

The invention thus contemplates, in one aspect thereof, a deposition process for the growth of barrier layers using supercritical fluids and mixtures thereof. A supercritical fluid solution containing the barrier layer precursor is delivered directly onto a heated substrate surface in a dynamic delivery process. The dynamic process allows the film to grow continuously on the substrate surface while the by-products are carried away in the SCF, e.g., $CO_2$, solution. Since the organic ligands are soluble in the SCF solution, the chance of contamination on the growing film surface is minimized.

The barrier layer materials applied to the substrate in the practice of the invention include copper diffusion barrier materials, and a variety of barrier materials that are effective in precluding or minimizing the occurrence of diffusion and migration of other metals. Barrier materials include, without limitation, tantalum (Ta), tantalum nitride ($TaN_x$), tantalum silicon nitride (TaSiN), titanium nitride ($TiN_x$), titanium silicon nitride (TiSiN), tungsten nitride ($WN_x$) and molybdenum nitride ($MoN_x$), wherein x is equal to the valency of the metal species in the nitride compound.

Considering specific barrier metals in further detail, Ta is an attractive barrier material due to its (1) high melting point, (2) immiscibility with copper, (3) high reactivity facilitating strong metal-metal bonding, (4) good conductivity, and (5) ability to form a low resistance ohmic contact having excellent adhesion to metals, e.g., copper.

$TaN_x$ possesses various advantages over the pure metal. For example, when a tantalum film is doped with small percentages of nitrogen, it forms $TaN_x$ that blocks grain boundary diffusion pathways, thereby constituting a superior diffusion barrier material for copper and copper-based alloys. Ideally, a barrier layer should have a dense, amorphous microstructure and a smooth surface free of microdefects.

By controlling the deposition process to vary the amount of nitrogen in the film layer, the resistivity and phase of the $TaN_x$ film can be correspondingly "tuned," thereby providing a large process window for barrier optimization. As the nitrogen in the film is increased, the film structure changes from a β-Ta phase to a low resistivity bcc-Ta(N) phase. Increasing the $N_2$ still further creates a mixture of amorphous or nanocrystalline $Ta_2N$ and $TaN_x$ phase. $TiN_x$ shows good copper diffusion barrier properties similar to $TaN_x$ but it is more attractive from an economic perspective due to the lower cost of the precursor material.

TaSiN is an amorphous material that exhibits very high copper diffusion barrier properties. Amorphous materials typically show good copper diffusion barrier properties under thermal stress since an amorphous layer has no grain boundaries to act as diffusion paths for copper atoms. However, maintaining uniform composition in a trench structure is more difficult with amorphous barriers, and thus such materials may be less preferred in some applications of the present invention, while being more preferred in other applications of the invention.

Amorphous $WN_x$ and $MoN_x$ exhibit excellent barrier diffusion properties against copper up to 800° C. while polycrystalline $WN_x$ is less effective in preventing copper diffusion than amorphous $WN_x$, due to partial release of nitrogen from poly-$WN_x$ at lower temperatures.

A wide variety of barrier precursors is deliverable in SCF-based compositions in the practice of the invention include. Some illustrative examples of specific barrier precursors include:

Metal β-diketonates
tantalum (V) tetraethoxyacetylacetonate, tantalum (V) (tetraethoxy), and tris(2,2,6,6-tetramethyl 3,5-heptanedionato) titanium (III), designated as $Ti(TMHD)_3$
Metal alkoxides
tantalum (V) ethoxide, tantalum (V) methoxide, tantalum (V) trifluoroethoxide, titanium (IV) n-butoxide, titanium (IV) t-butoxide, titanium (IV) ethoxide, and titanium (IV) i-propoxide
metal alkylamides
pentakis(dimethylamino)tantalum (V), pentakis(ethyl-methylamino)tantalum (V), tetrakis(diethylamino)titanium, and tetrakis(dimethylamino)titanium
metal carbonyls
$Mo(CO)_6$ and $W(CO)_6$ Although all of the foregoing compounds have appreciable solubility in various SCF media, e.g., $CO_2$ and/or $NH_3$, the oxide-containing metal precursors (i.e., β-diketonates and alkoxides) will be primarily used for the deposition of oxynitrides since oxide contamination could normally arise from decomposition of the oxide precursor, and the metal alkylamide precursors will be primarily used for the deposition of the pure nitrides. For silicide barrier layers, silicon-containing precursors will be primarily employed, such as silane and t-butyl $SiH_3$, depending on the solvent/co-solvent mixtures employed in a specific deposition formulation.

Useful interconnect material precursors include, without limitation, metal beta-diketonate precursors, such as (hfac) Cu (I) Lewis base adducts, as well as metal formates and metal acetates and their Lewis base adducts.

For barrier layer or interconnect deposition applications, the SCF-based deposition composition can usefully contain optional co-reactants such as ammonia ($NH_3$), hydrogen or other reducing co-reactants.

Barrier layer and metallization deposition applications can be carried out in any suitable manner, as regards the deposition process. For example, the SCF-based deposition composition can be delivered onto the substrate surface in a continuous manner, to effect continuous film growth on the substrate surface, with by-products of the deposition being carried away in the exhaust stream of supercritical fluid that is discharged from the deposition chamber. Alternatively, the SCF-based deposition composition may be transported to a vaporizer, whereby the deposition composition undergoes rapid expansion and vaporizes the precursor component(s) into precursor vapor. Such vaporization may be carried out at very low temperature, e.g., room temperature, with the resulting precursor vapor being directed onto the heated substrate surface to grow the desired film thereon.

Since precursor components are in many cases quite reactive, the selection of supercritical fluid is important to ensure chemical compatibility of the deposition composition. The supercritical fluids useful for the aforementioned barrier layer and metallization deposition include, without limitation, $CO_2$, $NH_3$, $CH_4$, $SF_6$, $N_2O$, CO, and the like.

In a particular aspect of the present invention, SCF-based deposition compositions are usefully employed for forming copper metallization on integrated circuitry substrates. In such application, the supercritical fluid facilitates a low surface tension, high-pressure technique for deposition of copper thin films in deep trench and high aspect ratio via structures.

The invention thus enables a method of low temperature metallization using supercritical fliuid deposition (SCFD) or chemical fluid deposition (CFD). A solvent in its supercritical state has properties, e.g., density, viscosity and diffusivity, that are intermediate between fluid and gaseous substances, with the fluid behavior including high solvating character, and the liquid behavior including excellent diffusivity and transport properties. Further, these specific properties can be continuously adjusted between gas-like and liquid-like by small variations in temperature and pressure without the need to physically change the solvent.

As compared to chemical vapor deposition wherein highly volatile precursors are required, the only requirement of supercritical fluid deposition is that the precursor be soluble in the supercritical fluid that is employed, and in most cases solubilities as low as $10^{-6}$ grams per cubic centimeter solvent are sufficient for transport.

The use of supercritical fluid compositions to deliver copper precursors for contacting with a heated substrate to deposit a copper thin film thereon in accordance with the invention may utilize any suitable copper precursor species. The copper precursors that can be utilized in the practice of the invention include non-volatile and low volatility copper organometallic compounds and complexes that are otherwise unsuitable for chemical vapor deposition or other vapor deposition methods. Among the copper precursors that can be delivered by supercritical fluid delivery are copper (II)

β-diketonates, copper (II) carboxylates, copper (I) cyclopentadienes, copper (I) phenyls, copper (I) amides, and Lewis base adducts of the aforementioned copper (I) species.

Supercritical fluid deposition (SCFD) is a process wherein one or more precursor species is solubilized in a high pressure, dense supercritical fluid, such as alcohols, amines, $CO_2$, etc., and subsequently transported in the supercritical fluid, along with any other co-solvents, surfactants and other components of the SCFD composition, to a reaction chamber containing a substrate. The SCFD composition is contacted with the substrate to effect deposition of the metal from the precursor on the substrate under appropriate deposition conditions therefore. Such deposition conditions are readily determinable within the skill of the art, based on the disclosure herein. The temperature and pressure of the SCFD composition is tuned so that the dense fluid is converted to a gas-like phase to cause separation of the precursor from this phase and formation of a thin film on the surface of the locally heated substrate via thermal and/or chemical decomposition.

The supercritical fluid species may in some instances not have sufficient solvating character to solvate the precursor of interest. In such circumstances, an appropriate co-solvent can be employed in the SCF-based composition, to increase the solubility of solute material(s) in the supercritical fluid. For example, solubility of metal cations in supercritical fluids such as supercritical $CO_2$ can be enhanced with metal complexes containing labile, soluble ligands such as β-diketonates, carboxylates, cyclopentadiene, phenyls, and amides. In addition to such ligands as being inexpensive and readily synthesized, most of such ligands can be manufactured as fluorine-free compositions, to eliminate any possibility of fluorine contamination of barrier surfaces that could otherwise reduce electrical contact resistance of the inter-metallic layer.

Copper precursors that can be employed in the SCF-based precursor compositions of the invention include, without limitation, the following copper precursor species:

(1) $Cu(acac)_2$
(2) $Cu(thd)_2$
(3) $Cu(dmhd)_2$
(4) $Cu(bzac)_2$
(5) $Cu(CHB)_2$
(6) $Cu(oxalate)$
(7) $Cu(formate)_2$
(8) $Cu(acetate)_2$
(9) $(VTMS)Cu(hfac)$
(10) $Cu(tod)_2$
(11) $CpCuPMe_3$
(12) $Cu(dibm)_2$
(13) $(CO)CuCl$
(14) $Cu(hfac)_2 \cdot H_2O$
(15) $Cu(hfac)_2$
(16) $Cu(tfbzm)_2$
(17) $(MHY)Cu(hfac)$
(18) $(COD)Cu(hfac)$
(19) $(DMCOD)Cu(hfac)$
(20) $Cu(pentafluorophenyl)$ pentamer
(21) $(VCH)Cu(hfac)$ wherein:
acac=pentane-2,4-dionate
bzac=1-phenylpentane-1,3-dionate
COD=cyclooctadiene
dibm=2,6-dimethylheptane-3,5-dionate
dmhd=1,1-dimethylhexane-3,5-dionate
MHY=2-methyl-1-hexene-3-yne
tfbzm=1,1,1-trifluoro-4-phenylbutane-2,4-dionate
thd=2,2,6,6-tetramethylheptane-3,5-dionate
tod=2,2,7-trimethyloctane-3,5-dionate
VCH=vinylcyclohexane
CHB=cyclohexanebutyrate
VTMS=vinyltrimethylsilane A wide variety of additives can be employed in the broad practice of the invention for enhancing the solubility of the precursor in the SCF composition. For example, in the use of copper (II) precursor compositions, the addition of isopropyl alcohol (IPA) can be employed as an additive to enhance the solubility of the precursor. In such application, the IPA also acts as a reducing agent for reducing Cu(II) to Cu(0) while the IPA itself is oxidized to acetone during the deposition process.

Compounds 13–21 in the foregoing list of copper precursors are less preferred in some applications due to their fluorine-containing ligands, and the associated capability for fluorine contamination of the deposited copper film, as well as fluorine abatement of the resultant effluent of the deposition process. They nonetheless may be highly advantageous in some applications, where issues associated with fluorine are insignificant or otherwise do not impact the use of such precursors as copper source reagents.

As an important aspect of the present invention, deposition of metal thin films using SCF-assisted techniques in accordance with the instant invention, relaxes the requirements for volatile metal precursors that would otherwise be necessary. By relaxing the requirement of volatile metal precursors, the SCF-assisted deposition techniques of the present invention obviate the need for fluorine-functionalized precursors, which are currently being increasingly used in the semiconductor manufacturing industry to satisfy precursor volatility requirements. For SCF-assisted deposition, the precursor component(s) need only be soluble in the SCF medium in order to be transported to the deposition chamber and thermally decomposed onto the heated substrate.

In specific application to copper metallization, the invention permits the use of low-cost, non-volatile copper (I) and copper (II) precursors for deposition of thin film copper without the need for fluorine-containing precursors. This flexibility in turn eliminates fluorine contamination on barrier surfaces and reduces electrical contact resistances of inter-metallic layers, such as M1 to M2 copper layers, and improves the adhesion of the copper film to nitride barriers.

In accordance with the invention, copper may be deposited on a substrate from SCF solution, utilizing a wide variety of non-volatile or low volatility copper precursors. Illustrative copper precursors include, without limitation, copper (II) β-diketonates, copper (II) carboxylates, copper (I) cyclopentadienes, copper (I) phenyls, copper (I) amides, and Lewis base adducts of the aforementioned copper (I) and copper (II) species. A preferred supercritical fluid for such copper deposition applications is carbon dioxide.

Since supercritical fluids exhibit liquid-like densities and gas-like viscosities, having solvating properties similar to those of organic solvents (e.g., pentane, hexane, and toluene), supercritical fluids can dissolve many copper compounds that are soluble in organic solvents. Supercritical fluid solutions containing copper precursor(s) are easily delivered to the film growth chamber for contacting with the substrate to deposit copper films thereon. Since surface tension is greatly reduced by the SCF in the deposition composition, the copper precursor is effectively delivered into trenches and via openings with very high aspect ratios, to achieve superior conformal coating therein.

Copper precursor components usefully employed in the broad practice of the present invention for copper deposition include, without limitation, the following:

Cu (II) (β-diketonato)$_2$ species, such as Cu (II) (acac)$_2$, Cu (II) (thd)$_2$ and Cu (tod)$_2$ as well as other non-fluorinated β-diketonate copper compounds and complexes;

Cu (carboxylate)$_2$ species, such as Cu (formate)$_2$ and Cu (acetate)$_2$ and other long-chain (e.g., $C_8$–$C_{40}$ and more preferably from $C_8$–$C_{30}$) carboxylates. Cu (formate)$_2$ is a preferred copper source reagent because the formate ligand is able to act as a reducing agent, leading to ultra-pure copper films upon thermal decomposition. Even higher solubility of copper formate in the SCF medium is obtainable by polyamine complexation of Cu (formate)$_2$. Copper (II) carboxylates are a preferred copper precursor species, since such compounds are relatively easy to synthesize, utilizing low-cost starting materials. Such compounds have not heretofore been contemplated for use in copper deposition applications, due to their poor volatility and poor transport characteristics, but are readily used for such purpose by formulation in SCF media in accordance with the present invention. As a result, the cost of ownership (COO) of copper deposition process systems is decreased by the use of such low cost copper precursors.

(Cyclopentadienyl) CuL complexes (wherein L is a suitable ligand species), for example CpCu (I) PMe$_3$. Such precursors are fluorine-free and are soluble in pentane and other organic solvents, and may be advantageously utilized in the practice of the present invention.

Copper (I) phenyl tetramers, such as copper (I) pentaflurophenyl or copper (I) t-butyl phenyl tetramer.

Copper (I) amides, such as bis(trimethylsilylamide) tetramer.

As alluded to above in respect of copper carboxylate precursors such as copper formate, the present invention contemplates SCF-based deposition compositions containing at least one copper precursor, wherein the copper precursor contains a ligand that serves as a reducing agent for production of ultrahigh-purity copper films on the substrate.

As a further alternative, the SCF-based deposition composition can comprise an SCF that is itself a reducing agent, or as a still further alternative, the SCF-based deposition composition can additionally optionally contain other reducing agent(s) for ensuring high purity copper deposition on the substrate. Suitable reducing agents for such purpose may be readily determined without undue experimentation, within the skill of the art. Illustrative reducing species include, without limitation, hydrogen and isopropyl alcohol.

In the SCF-based deposition compositions of the invention, various enhancing agents and other beneficial components may be incorporated in the composition.

For example, in SCF-based copper (II) precursor compositions, isopropyl alcohol may be added in a concentration of from about 0.1% to about 99.9% by weight, based on the weight of the SCF component(s). The use of IPA as an enhancing agent is highly advantageous when the SCF component is carbon dioxide, since isopropyl alcohol may increase copper precursor solubility in the supercritical carbon dioxide, while simultaneously functioning as a reducing agent to reduce Cu (II) to Cu (0). The isopropyl alcohol may be oxidized to acetone during the deposition process, and is readily recovered from the SCF effluent discharged from the deposition chamber, for recovery and reuse thereof, or alternatively for other disposition.

For copper deposition, the SCF can be of any suitable type, including, without limitation, $CO_2$, $CH_4$, $C_2H_6$, $CH_3OH$, $C_2H_5OH$, $(CH_3)_2CHOH$, $CH_3COCH_3$ and $SF_6$.

SCF-based copper precursor compositions of the invention afford a highly effective approach to deposition of copper films on substrates. Such compositions may be employed in semiconductor manufacturing operations as one of sequential deposition steps carried out in a cluster tool for wafer processing.

The SCF-based compositions and deposition methods of the invention are also amenable to the formation of electrodes via supercritical fluid delivery (SCFD), wherein the metal compound is dissolved in the supercritical fluid and transported to a reaction chamber wherein the particles undergo decomposition to the metal and/or metal oxide at the surface of a heated substrate. The deposition can be induced in a number of ways, including thermally and/or chemically.

SCFD has certain advantages over both CVD and PVD in that there is no need for expensive, potentially toxic, highly volatile precursors or high processing temperatures as are necessary in CVD and PVD. Further, SCFD readily achieves high concentrations of precursor, far higher than those attainable in CVD, due to the solvating power of the SCF component(s). These factors, along with the lower deposition temperatures enabled by SCFD, enable such method to achieve faster processing times and subsequent reduction in process costs.

The invention therefore contemplates the deposition of high purity noble metal and/or oxide thin films. Examples of the noble metal and/or noble metal oxides that can be advantageously deposited by the SCF-based compositions and methods of the invention include platinum (Pt), iridium (Ir), iridium oxide (IrO$_2$), ruthenium (Ru), ruthenium oxide (RuO$_2$), palladium (Pd), silver (Ag), and gold (Au). Such metals and metal oxides are useful in forming contact layers in integrated circuit processing. Precursors for such metals include the following illustrative precursor compounds:

(i) metal carbonyls;
(ii) metal (β-diketonate)$_x$.L wherein x=1, 2 or 3 and L=Lewis base ligand; and
(iii) mixed ligand compounds.

Illustrative metal carbonyl compounds include Ir$_3$(CO)$_{12}$ and Ru$_3$(CO)$_{12}$. These compounds are particularly interesting because of their low decomposition temperatures. Further, the solubility of the CO ligands in $CO_2$ when the SCF is supercritical carbon dioxide aids in the formation of contaminate-free films.

The metal (β-diketonate)$_x$.L compounds, wherein x=1, 2 or 3 and L=Lewis base ligand, can be of any suitable type. Illustrative compounds include:
(1,5-cyclooctadiene)Ir(I)(acac)
tris(norbornadiene)Ir(III)(acac)
(vinyltriethylsilane)Ag(I)(hexafluoroacetylacetonato)
bis(2,2,6,6-tetramethyl-3,5-heptanedionato)Ru(II)(1,5-cyclooctadiene)

Such compounds are readily dissolved in SCF media such as supercritical carbon dioxide, to provide high rate deposition of the corresponding metal and/or metal oxide.

The mixed ligand compounds include compounds such as:
(CH$_3$)$_2$Au(III)(acac)
tetrakis-(triphenylphosphine)platinum (0)
trimethyl-methylcyclopentadienyl platinum (IV)
tricarbonyl-methylcyclopentadienyl platinum (I)

The foregoing compounds are illustrative of those that can be employed in the broad practice of the invention to form noble metal and/or noble metal oxide electrodes.

In all applications of the present invention, the specific supercritical fluid component(s), co-solvents, and other ingredients of the SCF-containing precursor compositions can be readily determined by simple formulation of the specific precursor(s) with variation of components, and characterization of the resulting deposited film, to determine the specific formulation appropriate to deposition, in the given application. The process conditions for deposition can likewise be readily determined by variation of the particular temperature, pressure, flow rate, etc. conditions, to determine the set of process parameters best suited to a given deposition application of the invention. Such determinations can be made within the skill of the art, in light of the disclosure herein, without undue experimentation.

The deposition, as carried out under the desired process conditions of temperature and pressure, can be carried out in a continuous flow manner, with flow of the SCF-based precursor formulation through the deposition chamber during the deposition step, or alternatively the SCF-based precursor formulation can be introduced to the deposition chamber, and the deposition carried out in a batch-wise manner, or in a semi-batch fashion, wherein the SCF-based precursor formulation is introduced to the deposition chamber in sequential volumes, e.g., by injection to the deposition chamber. The substrate contacting time (of the SCF-based precursor formulation being exposed to the substrate) can be readily determined by empirical variation of contacting times and measurement of the resulting film thicknesses of the deposited material layer, to determine a growth rate and contacting time necessary in a given application of the invention.

It will be appreciated that the compositions and methods of the invention may be practiced in a widely variant manner, consistent with the broad disclosure herein. Accordingly, while the invention has been described herein with reference to specific features, aspects, and embodiments, it will be recognized that the invention is not thus limited, but is susceptible of implementation in other variations, modifications and embodiments. Accordingly, the invention is intended to be broadly construed to encompass all such other variations, modifications and embodiments, as being within the scope of the invention hereinafter claimed.

What is claimed is:

1. A deposition composition for depositing material on a substrate, said deposition composition comprising a supercritical fluid and a precursor of the material to be deposited on the substrate, wherein said precursor includes a metal atom, and wherein said material to be deposited comprises a material selected from the group consisting of high-k material, copper diffusion barrier material, nitride material, metal nitride material, barrier layer material, oxynitride barrier layer material, nitride barrier layer material, silicide barrier layer material, and copper seed layer material, with the proviso that when the material to be deposited comprises the copper seed layer material, the precursor comprises at least one copper precursor selected from the group consisting of copper (II) carboxylates, copper (I) cyclopentadienes, copper (I) phenyls, copper (I) amides, and Lewis base adducts of the aforementioned copper (I) species.

2. The deposition composition of claim 1, wherein the supercritical fluid comprises a fluid selected from the group consisting of: carbon dioxide, oxygen, argon, krypton, xenon, ammonia, methane, ethane, methanol, ethanol, isopropanol, dimethyl ketone, sulfur hexafluoride, carbon monoxide, dinitrogen oxide, forming gas, hydrogen, and mixtures thereof.

3. The deposition composition of claim 1, wherein the supercritical fluid comprises carbon dioxide.

4. The deposition composition of claim 1, wherein said composition comprises a co-solvent.

5. The deposition composition of claim 1, consisting essentially of said supercritical fluid and said precursor.

6. The deposition composition of claim 1, consisting of said supercritical fluid and said precursor.

7. The deposition composition of claim 1, wherein said precursor comprises a barrier layer precursor for forming a metal nitride or metal oxynitride barrier layer.

8. The deposition composition of claim 7, wherein said metal nitride or metal oxynitride comprises at least one metal selected from the group consisting of tantalum, titanium, silicon, tungsten and molybdenum.

9. A deposition composition for depositing material on a substrate, said deposition composition comprising a supercritical fluid and a silicon precursor of the material to be deposited on the substrate, wherein the silicon precursor comprises a cyclosiloxane.

10. The deposition composition of claim 9, wherein said material deposited on the substrate is a low k organosilicate material.

11. The deposition composition of claim 9, wherein the cyclosiloxane precursor comprises a siloxane selected from the group consisting of tetramethylcyclotetrasiloxane (TM-CTS) and octamethyltetracyclosiloxane (OMCTS).

12. A deposition composition for depositing material on a substrate, said deposition composition comprising a supercritical fluid, a silicon precursor of the material to be deposited on the substrate, and cube monomers, wherein the silicon precursor comprises a silsesquioxane having the formula:

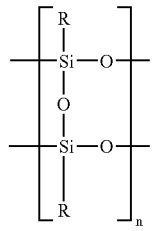

wherein each R is independently selected from H, $C_1$–$C_8$ alkyl, $C_1$–$C_8$ alkenyl, $C_6$–$C_{10}$ aryl and $C_1$–$C_8$ alkoxy.

13. The deposition composition of claim 12, wherein said material deposited on the substrate is a mesoporous organo-functionalized silsesquioxane (SSQ) material.

14. The deposition composition of claim 12, wherein the cube monomers have epoxy and hexyl groups attached to a same cluster of the monomer.

15. The deposition composition of claim 1, wherein said precursor comprises a precursor for Conning a high k material on the substrate at deposition temperature below 300° C., said precursor comprising a metal and an organo moiety.

16. The deposition composition of claim 15, wherein the metal is selected from the group consisting of Ba, Sr, La, and Pb, and wherein the organo moiety is selected from the group consisting of $C_1$–$C_8$ alkoxides, β-diketonates, carbonates, hydroxides, acetates, formates, nitrates, halides, $C_5$–$C_{10}$ aryls, $C_1$–$C_8$ alkyls, and mixtures of two or more of the foregoing.

17. The deposition composition of claim 15, wherein the metal is selected from the group consisting of Ti, Zr and Ta, and wherein the organo moiety is selected from the group consisting of carbonates, hydroxides, acetates, formates, nitrates, halides, $C-C_{10}$ aryls, $C_1-C_8$ alkyls, and mixtures of two or more of the foregoing.

18. The deposition composition of claim 1, wherein the precursor comprises an organometallic compound selected from the group consisting of tetraphenyl lead and triphenyl bismuth.

19. The deposition composition of claim 1, comprising a solvent/co-solvent species selected from the group consisting of carbon dioxide, water, ammonia and alcohols.

20. The deposition composition of claim 1, wherein the supercritical fluid comprises ammonia.

21. The deposition composition of claim 20, wherein the precursor comprises a precursor for forming a nitride material on the substrate.

22. The deposition composition of claim 21, wherein the precursor has a decomposition temperature below 200° C.

23. The deposition composition of claim 22, wherein the precursor comprises a non-oxide metal-containing precursor.

24. The deposition composition of claim 1, wherein the supercritical fluid comprises carbon dioxide and the precursor comprises a precursor for forming a metal nitride material on the substrate.

25. The deposition composition of claim 1, wherein the precursor comprises a precursor for forming a copper diffusion barrier material on the substrate.

26. The deposition composition of claim 25, wherein the copper diffusion barrier material comprises a material selected from the group consisting of tantalum (Ta), tantalum nitride ($TaN_x$), tantalum silicon nitride (TaSiN), titanium nitride ($TiN_x$), titanium silicon nitride (TiSiN), tungsten nitride ($WN_x$) and molybdenum nitride ($MoN_x$), wherein x is equal to the valency of the metal species in the nitride compound.

27. The deposition composition of claim 25, wherein the copper diffusion barrier material comprises an amorphous material.

28. The deposition composition of claim 26, wherein the copper diffusion barrier material comprises an amorphous material.

29. The deposition composition of claim 26, wherein the copper diffusion barrier material comprises a material selected from the group consisting of ($TaN_x$) and titanium nitride ($TiN_x$).

30. The deposition composition of claim 26, wherein the copper diffusion barrier material comprises TaSiN.

31. The deposition composition of claim 26, wherein the copper diffusion barrier material comprises a material selected from the group consisting of tungsten nitride ($WN_x$) and molybdenum nitride ($MoN_x$).

32. The deposition composition of claim 1, wherein the material comprises a barrier layer material and the precursor comprises at least one precursor selected from the group consisting of metal alkylamides and metal carbonyls.

33. The deposition composition of claim 1, wherein the material comprises a barrier layer material and the precursor comprises at least one precursor selected from the group consisting of tantalum (V) tetraethoxyacetylacetonate; tantalum (V) (tetraethoxy); tris(2,2,6,6-tetramethyl-3,5-heptanedionato) titanium (III); tantalum (V) trifluoroethoxide; pentakis(dimethylamino) tantalum (V); pentakis(ethyl-methylamino) tantalum (V); tetrakis(diethylamino) titanium; tetrakis(dimethylamino) titanium; $Mo(CO)_6$ and $W(CO)_6$.

34. The deposition composition of claim 1, wherein the material comprises an oxynitride barrier layer material and the precursor comprises at least one precursor selected from the group consisting of metal β-diketonates and metal alkoxides.

35. The deposition composition of claim 1, wherein the material comprises a nitride barrier layer material and the precursor comprises at least one precursor selected from the group consisting of metal alkylamides.

36. The deposition composition of claim 1, wherein the material comprises a silicide barrier layer material and the precursor comprises at least one silicon-containing precursor.

37. The deposition composition of claim 36, wherein the at least one silicon-containing precursor comprises a precursor species selected from the group consisting of silane and t-butyl silane.

38. The deposition composition of claim 1, wherein the precursor comprises a metal complex including at least one ligand selected from the group consisting of carboxylates, cyclopentadiene, phenyls, and amides.

39. The deposition composition of claim 38, wherein the metal complex is fluorine-free.

40. A deposition composition for depositing material on a substrate, said deposition composition comprising a supercritical fluid and a precursor of the material to be deposited on the substrate, wherein the precursor comprises at least one copper precursor selected from the group consisting of
(1) Cu(pentafluorophenyl) pentamer
(2) $Cu(thd)_2$
(3) $Cu(dmhd)_2$
(4) $Cu(bzac)_2$
(5) $Cu(CHB)_2$
(6) Cu(oxalate)
(7) $Cu(formate)_2$
(8) $Cu(acetate)_2$
(9) (VTMS)Cu(hfac)
(10) $Cu(tod)_2$
(11) $CpCuPMe_3$
(12) $Cu(dibm)_2$
(13) (CO)CuCl
(14) (VCH)Cu(hfac)
(15) $Cu(tfbzm)_2$
(16) (MHY)Cu(hfac)
(17) (COD)Cu(hfac)
(18) (DMCOD)Cu(hfac)
wherein:
bzac=1-phenylpentane-1,3-dionate
COD=cyclooctadiene
dibm=2,6-dimethylheptane-3,5-dionate
dmhd=1,1-dimethylhexane-3,5-dionate
MHY=2-methyl-1-hexene-3-yne
tfbzm=1,1,1-trifluoro-4-phenylbutane-2,4-dionate
thd=2,2,6,6-tetramethylheptane-3,5-dionate
tod=2,2,7-trimethyloctane-3,5-dionate
VCH=vinylcyclohexane
CHB=cyclohexanebutyrate
VTMS=vinyltrimethylsilane.

41. The deposition composition of claim 1, wherein the precursor comprises a copper (II) precursor, and the composition further comprises isopropyl alcohol.

42. A deposition composition for depositing material on a substrate, said deposition composition comprising a supercritical fluid and a precursor of the material to be deposited on the substrate, wherein the material to be formed on the substrate consists essentially of a noble metal and/or a noble metal oxide, and wherein the precursor comprises a metal precursor selected from the group consisting of
(i) metal carbonyls;

(ii) metal (β-diketonate)$_x$.L wherein x=1, 2 or 3 and L=Lewis base ligand; and
(iii) mixed ligand compounds.

43. The deposition composition of claim 42, wherein the noble metal and/or noble metal oxide comprises a metal/metal oxide species selected from the group consisting of platinum (Pt), iridium oxide (IrO$_2$), ruthenium oxide (RuO$_2$), palladium (Pd), and silver (Ag).

44. The deposition composition of claim 42, wherein the supercritical fluid comprises supercritical carbon dioxide.

45. The deposition composition of claim 42, wherein the metal (β-diketonate)$_x$.L precursor comprises
(1,5-cyclooctadiene)Ir(I)(acac);
tris(norbornadiene)Ir(III)(acac);
(vinyltriethylsilane)Ag(I)(hexafluoroacetylacetonato); and
bis(2,2,6,6-tetramethyl-3,5-heptanedionato)Ru(II)(1,5-cyclooctadiene).

46. The deposition composition of claim 42, wherein the precursor comprises a mixed ligand composition including a compound selected from the group consisting of
(CH$_3$)$_2$Au(III)(acac);
tetrakis-(triphenylphosphine)platinum (0);
trimethyl-methylcyclopentadienyl platinum (IV); and
tricarbonyl-methylcyclopentadienyl platinum (I).

47. A method of forming a material on a substrate, comprising depositing the material on the substrate from a deposition composition comprising a precursor of said material, and a supercritical fluid, wherein said precursor includes a metal atom, and wherein said material to be deposited comprises a material selected from the group consisting of high-k material, copper diffusion barrier material, nitride material, metal nitride material, barrier layer material, oxynitride barrier layer material, nitride barrier layer material, silicide barrier layer material, and copper seed layer material, with the proviso that when the material to be deposited comprises the copper seed layer material, the precursor comprises at least one copper precursor selected from the group consisting of copper (II) carboxylates, copper (I) cyclopentadienes, copper (I) phenyls, copper (I) amides, and Lewis base adducts of the aforementioned copper (I) species.

48. The method of claim 47, wherein the supercritical fluid comprises a fluid selected from the group consisting of: carbon dioxide, oxygen, argon, krypton, xenon, ammonia, methane, ethane, methanol, ethanol, isopropanol, dimethyl ketone, sulfur hexafluoride, carbon monoxide, dinitrogen oxide, forming gas, hydrogen, and mixtures thereof.

49. The method of claim 47, wherein the supercritical fluid comprises carbon dioxide.

50. The method of claim 47, wherein said composition comprises a co-solvent.

51. The method of claim 47, wherein the deposition composition consists essentially of said supercritical fluid and said precursor.

52. The method of claim 47, wherein the deposition composition consists of said supercritical fluid and said precursor.

53. The method of claim 47, wherein said precursor comprises a barrier layer precursor for forming a metal nitride or metal oxynitride barrier layer.

54. The method of claim 53, wherein said metal nitride or metal oxynitride comprises at least one metal selected from the group consisting of tantalum, titanium, silicon, tungsten and molybdenum.

55. A method of forming a material on a substrate, comprising depositing the material on the substrate from a deposition composition comprising a silicon precursor of said material and a supercritical fluid, wherein the silicon precursor comprises a cyclosiloxane.

56. The method of claim 55, wherein said material deposited on the substrate is a low k organosilicate material.

57. The method of claim 55, wherein the cyclosiloxane precursor comprises a siloxane selected from the group consisting of tetramethylcyclotetrasiloxane (TMCTS) and octamethyltetracyclosiloxane (OMCTS).

58. A method of forming a material on a substrate, comprising depositing the material on the substrate from a deposition composition comprising a silicon precursor of said material, a supercritical fluid, and cube monomers, wherein the silicon precursor comprises a silsesquioxane having the formula:

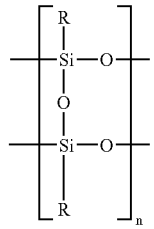

wherein each R is independently selected from H, C$_1$–C$_8$ alkyl, C$_1$–C$_8$ alkenyl, C$_6$–C$_{10}$ aryl and C$_1$–C$_8$ alkoxy.

59. The method of claim 58, wherein said material deposited on the substrate is a mesoporous organo-functionalized silsesquioxane (SSQ) material.

60. The method of claim 58, wherein cube monomers have epoxy and hexyl groups attached to a same cluster of the monomer.

61. The method of claim 47, wherein said precursor comprises a precursor for forming a high k material on the substrate at deposition temperature below 300° C., said precursor comprising a metal and an organo moiety.

62. The method of claim 61, wherein the metal is selected from the group consisting of Ba, Sr, La, and Pb, and wherein the organo moiety is selected from the group consisting of C$_1$–C$_8$ alkoxides, β-diketonates, carbonates, hydroxides, acetates, formates, nitrates, halides, C$_5$–C$_{10}$ aryls, C$_1$–C$_8$ alkyls, and mixtures of two or more of the foregoing.

63. The method of claim 61, wherein the metal is selected from the group consisting of Ti, Zr and Ta, and wherein the organo moiety is selected from the group consisting of carbonates, hydroxides, acetates, formates, nitrates, halides, C$_6$C$_{10}$ aryls, C$_1$–C$_8$ alkyls, and mixtures of two or more of the foregoing, with the proviso that when the organo moiety is C$_1$–C$_8$ alkoxide or β-diketonate, the metal cannot be Ta, Ti or Zr.

64. The method of claim 47, wherein the precursor comprises an organometallic compound selected from the group consisting of tetraphenyl lead and triphenyl bismuth.

65. The method of claim 47, comprising a solvent/co-solvent species selected from the group consisting of carbon dioxide, water, ammonia and alcohols.

66. The method of claim 47, wherein the supercritical fluid comprises ammonia.

67. The method of claim 47, wherein the precursor comprises a precursor for forming a nitride material on the substrate.

68. The method of claim 67, wherein the precursor has a decomposition temperature below 200° C.

69. The method of claim 68, wherein the precursor comprises a non-oxide metal-containing precursor.

70. The method of claim 47, wherein the supercritical fluid comprises carbon dioxide and the precursor comprises a precursor for forming a metal nitride material on the substrate.

71. The method of claim 47, wherein the precursor comprises a precursor for forming a copper diffusion barrier material on the substrate.

72. The method of claim 71, wherein the copper diffusion barrier material comprises a material selected from the group consisting of tantalum (Ta), tantalum nitride ($TaN_x$), tantalum silicon nitride (TaSiN), titanium nitride ($TiN_x$), titanium silicon nitride (TiSiN), tungsten nitride ($WN_x$) and molybdenum nitride ($MoN_x$), wherein x is equal to the valency of the metal species in the nitride compound.

73. The method of claim 71, wherein the copper diffusion barrier material comprises an amorphous material.

74. The method of claim 72, wherein the copper diffusion barrier material comprises an amorphous material containing silicon.

75. The method of claim 72, wherein the copper diffusion barrier material comprises a material selected from the group consisting of ($TaN_x$) and titanium nitride ($TiN_x$).

76. The method of claim 72, wherein the copper diffusion barrier material comprises TaSiN.

77. The method of claim 72, wherein the copper diffusion barrier material comprises a material selected from the group consisting of tungsten nitride ($WN_x$) and molybdenum nitride ($MoN_x$).

78. The method of claim 47, wherein the material comprises a barrier layer material and the precursor comprises at least one precursor selected from the group consisting of metal alkylamides and metal carbonyls.

79. The method of claim 47, wherein the material comprises a barrier layer material and the precursor comprises at least one precursor selected from the group consisting of tantalum (V) tetraethoxyacetylacetonate; tantalum (V) (tetraethoxy); tris(2,2,6,6-tetramethyl-3,5-heptanedionato) titanium (III); tantalum (V) trifluoroethoxide; pentakis(dimethylamino) tantalum (V); pentakis(ethyl-methylamino) tantalum (V); tetrakis(diethylamino) titanium; tetrakis(dimethylamino) titanium; $Mo(CO)_6$ and $W(CO)_6$.

80. The method of claim 47, wherein the material comprises an oxynitride barrier layer material and the precursor comprises at least one precursor selected from the group consisting of metal β-diketonates and metal alkoxides.

81. The method of claim 47, wherein the material comprises a nitride barrier layer material and the precursor comprises at least one precursor selected from the group consisting of metal alkylamides.

82. The method of claim 47, wherein the material comprises a silicide barrier layer material and the precursor comprises at least one silicon-containing precursor.

83. The method of claim 82, wherein the at least one silicon-containing precursor comprises a precursor species selected from the group consisting of silane and t-butyl silane.

84. The method of claim 47, wherein the precursor comprises a metal complex including at least one ligand selected from the group consisting of carboxylates, cyclopentadiene, phenyls, and amides.

85. The method of claim 84, wherein the metal complex is fluorine-free.

86. A method of forming a material on a substrate, comprising depositing the material on the substrate from a deposition composition comprising a precursor of said material, and a supercritical fluid, wherein the precursor comprises at least one copper precursor selected from the group consisting of
(1) Cu(pentafluoropbenyl) pentamer
(2) $Cu(thd)_2$
(3) $Cu(dmhd)_2$
(4) $Cu(bzac)_2$
(5) $Cu(CHB)_2$
(6) Cu(oxalate)
(7) $Cu(formate)_2$
(8) $Cu(acetate)_2$
(9) (VTMS)Cu(hfac)
(10) $Cu(tod)_2$
(11) $CpCuPMe_3$
(12) $Cu(dibm)_2$
(13) (CO)CuCl
(14) (VCH)Cu(hfac)
(15) $Cu(tfbzm)_2$
(16) (MHY)Cu(hfac)
(17) (COD)Cu(hfac)
(18) (DMCOD)Cu(hfac)
wherein:
bzac=1-phenylpentane-1,3-dionate
COD=cyclooctadiene
dibm=2,6-dimethylheptane-3,5-dionate
dmhd=1,1-dimethylhexane-3,5-dionate
MHY=2-methyl-1-hexene-3-yne
tfbzm=1,1,1-trifluoro-4-phenylbutane-2,4-dionate
thd=2,2,6,6-tetramethylheptane-3,5-dionate
tod=2,2,7-trimethyloctane-3,5-dionate
VCH=vinylcyclohexane
CHB=cyclohexanebutyrate
VTMS=vinyltrimethylsilane.

87. The method of claim 47, wherein the precursor comprises a copper (II) precursor, and the composition further comprises isopropyl alcohol.

88. A method of forming a material on a substrate, comprising depositing the material on the substrate from a deposition composition comprising a precursor of said material, and a supercritical fluid, wherein the material to be formed on the substrate consists essentially of a noble metal and/or a noble metal oxide, and wherein the precursor comprises a metal precursor selected from the group consisting of
(i) metal carbonyls;
(ii) metal (β-diketonate)$_x$·L wherein x=1, 2 or 3 and L=Lewis base ligand; and
(iii) mixed ligand compounds.

89. The method of claim 88, wherein the noble metal and/or noble metal oxide comprises a metal/metal oxide species selected from the group consisting of platinum (Pt), iridium oxide ($IrO_2$), ruthenium oxide ($RuO_2$), palladium (Pd), and silver (Ag).

90. The method of claim 88, wherein the supercritical fluid comprises supercritical carbon dioxide.

91. The method of claim 88, wherein the metal (β-diketonate)$_x$·L precursor comprises
(1,5-cyclooctadiene)Ir(I)(acac);
tris(norbornadiene)Ir(Ill)(acac);
(vinyltriethylsilane)Ag(I)(hexafluoroacetylacetonato); and
bis(2,2,6,6-tetramethyl-3,5-heptanedionato)Ru(II)(1,5-cyclooctadiene).

92. The method of claim 88, wherein the precursor comprises a mixed ligand composition including a compound selected from the group consisting of
$(CH_3)_2Au(III)(acac)$;

tetrakis-(triphenylphosphine)plantinum (0);
trimethyl-methylcyclopentadienyl platinum (IV); and
tricarbonyl-methylcyclopentadienyl platinum (I).

93. A method of forming a low k organosilicate film on a substrate, comprising contacting the substrate with a deposition composition comprising an organosilicon compound and a supercritical fluid, to deposit a silicon-containing material on the substrate, and vitrifying the silicon-containing material to form said low k organosilicate film as a porous organosilicate film on the substrate.

94. The method of claim 93, comprising controlling the porosity of the porous organosilicate film to yield the porous organosilicate film as a film having a predetermined dielectric constant.

95. The method of claim 94, wherein porosity is controlled by controlled incorporation of air bubbles in the silicon-containing material deposited on the substrate.

96. A method of forming a barrier layer on a substrate, comprising contacting the substrate in a contacting zone with a deposition composition comprising a barrier layer precursor and a supercritical fluid, and continuing said contacting while flowing the deposition composition into the contacting zone, and discharging contacted deposition composition from said contacting zone, to effect growth of the barrier layer to a predetermined thickness.

97. A deposition composition for depositing material on a substrate, said deposition composition comprising a supercritical fluid and a precursor of the material to be deposited on the substrate, wherein said precursor is selected from the group consisting of: a barrier layer precursor for forming a metal nitride barrier layer; a barrier layer precursor for forming a metal silicon nitride barrier layer; a barrier layer precursor for forming a metal oxynitride barrier layer; a precursor for forming a high k material on the substrate at deposition temperature below 300° C.; tetraphenyl lead; triphenyl bismuth; a precursor for forming a copper diffusion barrier material on the substrate; and at least one copper precursor selected from the group consisting of copper (II) carboxylates, copper (I) cyclopentadienes, copper (I) phenyls, copper (I) amides, and Lewis base adducts of the aforementioned copper (I) species.

98. A deposition composition for depositing material on a substrate, said deposition composition comprising a supercritical fluid and a silicon precursor, wherein the silicon precursor comprises at least one siloxane and at least one alkylsilane.

99. The deposition composition of claim 98, wherein the alkylsilane comprises a silane selected from the group consisting of trimethylsilane and tetramethylsilane.

100. The deposition composition of claim 98, wherein the silicon precursor comprises a siloxane, and the composition further comprises a porogen effective in combination with the siloxane to form a porous low k film on the substrate.

101. A method of forming a material on a substrate, comprising depositing the material on the substrate from a deposition composition comprising a silicon precursor, and a supercritical fluid, wherein the silicon precursor comprises at least one siloxane and at least one alkylsilane.

102. The method of claim 101, wherein the alkylsilane comprises a silane selected from the group consisting of trimethylsilane and tetramethylsilane.

103. The method of claim 101, wherein the silicon precursor comprises a siloxane, and the composition further comprises a porogen effective in combination with the siloxane to form a porous low k film on the substrate.

104. A deposition composition for depositing material on a substrate, said deposition composition comprising a supercritical fluid and a precursor of the material to be deposited on the substrate, wherein said precursor comprises a metal complex including at least one ligand selected from the group consisting of carboxylates, cyclopentadiene, phenyls, and amides.

105. The deposition composition of claim 9, further comprising a porogen.

106. The deposition composition of claim 105, wherein said material deposited on the substrate is a porous low k film precursor.

107. The method of claim 55, wherein the deposition composition further comprises a porogen.

108. The method of claim 107, wherein said material deposited on the substrate is a porous low k film precursor.

109. The method of claim 108, further comprising treating said material deposited on said substrate to form a porous low k film.

110. A method of manufacturing a semiconductor comprising depositing a material on a substrate using the deposition composition of claim 1, wherein said semiconductor comprises said substrate.

111. A method of manufacturing a semiconductor comprising depositing a material on a substrate using the deposition composition of claim 9, wherein said semiconductor comprises said substrate.

112. A method of manufacturing a semiconductor comprising depositing a material on a substrate using the deposition composition of claim 12, wherein said semiconductor comprises said substrate.

113. A method of manufacturing a semiconductor comprising depositing a material on a substrate using the deposition composition of claim 40, wherein said semiconductor comprises said substrate.

114. A method of manufacturing a semiconductor comprising depositing a material on a substrate using the deposition composition of claim 42, wherein said semiconductor comprises said substrate.

* * * * *

UNITED STATES PATENT AND TRADEMARK OFFICE
CERTIFICATE OF CORRECTION

PATENT NO. : 7,119,418 B2
APPLICATION NO. : 10/632009
DATED : October 10, 2006
INVENTOR(S) : Chongying Xu et al.

It is certified that error appears in the above-identified patent and that said Letters Patent is hereby corrected as shown below:

Column 18, line 54, "Conning" should be --forming--
Column 19, line 2, "C-$C_{10}$" should be --$C_8$-$C_{10}$--
Column 21, line 1, "(ß-diketonate)$_x$.L" should be --(ß-diketonate)$_x$·L--
Column 21, line 12, "(ß-diketonate)$_x$.L" should be --(ß-diketonate)$_x$·L--
Column 22, line 44, "$C_5$-$C_{10}$" should be --$C_6$-$C_{10}$--
Column 24, line 40, please delete the "," after the word "fluid"
Column 24, line 46, "(ß-diketonate)$_x$.L" should be --(ß-diketonate)$_x$·L--
Column 24, line 57, "(ß-diketonate)$_x$.L" should be --(ß-diketonate)$_x$·L--
Column 25, line 7, please insert a space after "fluid,"
Column 25, lines 50-53, please cancel claim 100
Column 26, lines 9-12, please cancel claim 103

Signed and Sealed this

Twenty-first Day of August, 2007

JON W. DUDAS
*Director of the United States Patent and Trademark Office*